(12) United States Patent
Machida

(10) Patent No.: US 7,956,661 B2
(45) Date of Patent: Jun. 7, 2011

(54) STANDARD CELL AND SEMICONDUCTOR DEVICE

(75) Inventor: Hirohisa Machida, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 86 days.

(21) Appl. No.: 12/362,271

(22) Filed: Jan. 29, 2009

(65) Prior Publication Data

US 2009/0189663 A1    Jul. 30, 2009

(30) Foreign Application Priority Data

Jan. 29, 2008    (JP) .................................. 2008-017574

(51) Int. Cl.
*H03K 3/00*    (2006.01)
(52) U.S. Cl. ........................................ 327/199; 327/407
(58) Field of Classification Search .................. None
See application file for complete search history.

(56) References Cited

U.S. PATENT DOCUMENTS

| | | | |
|---|---|---|---|
| 6,570,940 B2 * | 5/2003 | Yamaguchi et al. | 375/341 |
| 6,603,722 B1 * | 8/2003 | Taguchi et al. | 369/59.21 |
| 6,678,849 B1 * | 1/2004 | Shiraishi et al. | 714/729 |
| 6,697,442 B1 * | 2/2004 | Todoroki | 375/341 |

FOREIGN PATENT DOCUMENTS

JP    2002-267723 A    9/2002

* cited by examiner

*Primary Examiner* — Lincoln Donovan
*Assistant Examiner* — Sibin Chen
(74) *Attorney, Agent, or Firm* — Miles & Stockbridge P.C.

(57) ABSTRACT

The present invention provides a standard cell and a scan flip flop circuit capable of introducing a scan test also to a system LSI having an ACS circuit. One standard cell is configured by: a 3-input selection circuit for selecting one signal from three input signals; and a flip flop circuit. The 3-input selection circuit receives a control signal and a test signal at its control input part and its first input part, respectively. First and second signals are supplied to second and third input parts, and a selection signal is supplied to a selector input part. On the basis of the control signal and the selection signal, any of the signals input to the first to third input parts is output from the output part.

3 Claims, 5 Drawing Sheets

FIG. 3
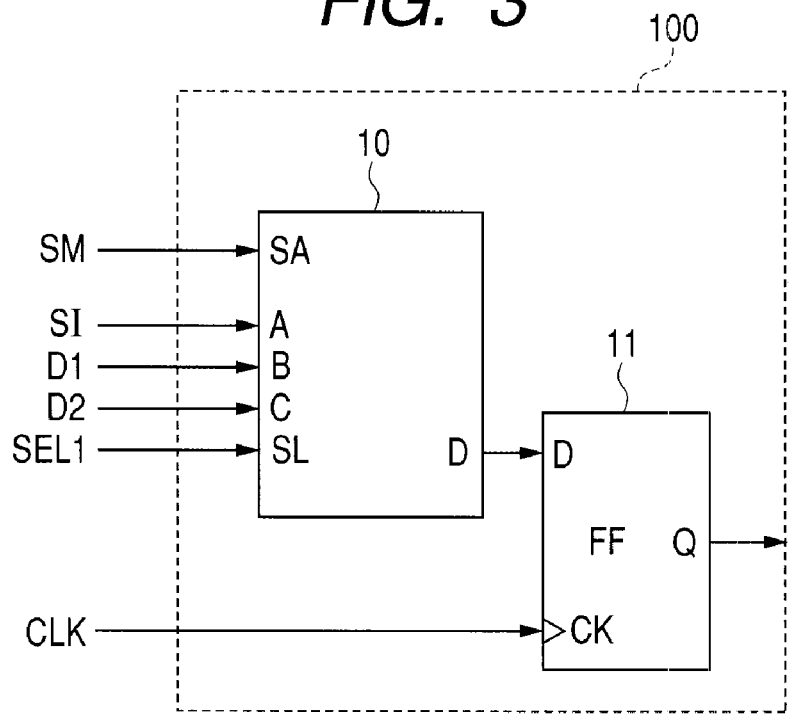
FIG. 4
| SM | SEL1 | D |
|---|---|---|
| 1 | x | SI |
| 0 | 1 | D1 |
| 0 | 0 | D2 |
FIG. 5
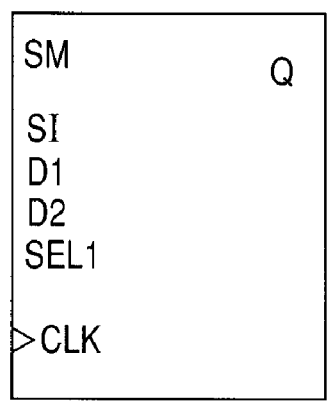

STANDARD CELL AND SEMICONDUCTOR DEVICE

CROSS-REFERENCE TO RELATED APPLICATIONS

The disclosure of Japanese Patent Application No. 2008-17574 filed on Jan. 29, 2008 including the specification, drawings and abstract is incorporated herein by reference in its entirety.

BACKGROUND OF THE INVENTION

The present invention relates to a standard cell and a semiconductor device having a scan flip flop circuit for use in a system LSI (Large Scale Integrated circuit).

As the semiconductor technique develops, the number of logic circuits which can be mounted on a single semiconductor integrated circuit device is increasing dramatically. At present, one million or more logic circuits can be mounted on a common semiconductor integrated circuit device. It is therefore impossible to design the logic circuits one by one by a human. Such a semiconductor integrated circuit device is called a system LSI.

Therefore, a system LSI is designed on the basis of automatic designing using a computer with an EDA (Engineering Design Automation) tool. When the functions and architecture of a system are designed using an advanced function description language or the like, a logic synthesis tool automatically generates a logic circuit. An automatic placement and wiring tool converts the logic circuit to physical layout data. By using the physical data, LSIs can be mass-produced in a factory or the like.

Problems which become obvious as the scale of a logic circuit is becoming larger and a system LSI is designed automatically include a problem of designing of a test circuit and a problem of clock designing.

A test circuit is a circuit for determining a completed system LSI is accurately manufactured or not. Since a logic circuit in the system LSI is automatically designed, it is also difficult to manually design a test circuit for testing the logic circuit. Consequently, it is becoming natural to automatically design a test circuit.

As a method of testing a system LSI, a method called a scan test of using a test circuit in which a flip flop circuit (hereinbelow, abbreviated as FF circuit) in a system LSI is replaced with a scan flip flop circuit (hereinbelow, abbreviated as SFF circuit) is well known. For example, it is written specifically in FIGS. 12 to 20 of patent document 1.

A test circuit is automatically designated by replacing an FF circuit in a system LSI with an SFF circuit and coupling SFF circuits in order (scan path coupling) in a scan test.

As understood from FIG. 12 of the patent document 1, in the system LSI, logic circuits capable of realizing functions of the system LSI are arranged between logic circuits capable of storing data like FF circuits. Consequently, many FF circuits exist in a single system LSI. It is very important to supply the same clock signal, that is, clock signals which change to "1" or "0" at the same timing to the FF circuits. From the viewpoint of designing a system LSI, it is an important task to reduce a deviation (called clock skew) of timings at which the clock signals change in arbitrary two FF circuits.

When a clock skew exists, a hold error that an erroneous output of a logic circuit is stored in an FF circuit occurs. In this case, even if the cycle of the clock signal is delayed, the system LSI does not operate accurately.

100,000 or more SFF circuits are used in a system LSI at present. It is impossible to prevent a hold error in all of the SFF circuit statistically. Consequently, when a clock skew exists after generation of final layout, it has to be eliminated. To correct an erroneous part, a new buffer circuit is inserted or a wiring path is changed. It may cause a hold error in other SFF circuits. Usually, the correction cannot be made easily.

In the case of using a scan test, an SFF circuit has a configuration having an FF circuit and a 2-input selection circuit arranged before the FF circuit. Since the 2-input selection circuit is added for a test, the number of logic stages increases.

When the number of logic stages increases, a signal delay of the amount occurs. The signal delay is a big issue in the data communication field.

In the data communication field, a convolution code or the like is often used for restoring communication information influenced by noise or the like in a communication path on the reception side. Generally, Viterbi decoding is used as a method of restoring a convolution code, and a main logic circuit of the Viterbi decoding is called an ACS circuit.

The ACS circuit stands for "Add, Compare, and Select", and is comprised of, as the name suggests, an adder, a comparator, and a selector.

In the above-described scan test, the ACS circuit corresponds to a logic circuit between SFF circuits. In this case, the selector existing in the SFF circuit cannot be ignored as a delay element. Consequently, in a system LSI having the ACS circuit, the SFF circuit cannot be used, and a scan test cannot be employed.

[Patent Document 1]
Japanese Unexamined Patent Publication No. 2002-267723 (FIGS. 12 to 20)

SUMMARY OF THE INVENTION

As described above, in a conventional ACS circuit, to reduce a delay path, the SFF circuit is not used but a normal FF circuit is used. There is consequently a problem such that fault coverage at the time of a circuit test is low.

The present invention has been achieved to solve the problem and an object of the invention is to provide a standard cell and a scan flip flop circuit capable of introducing a scan test also to a system LSI having an ACS circuit.

In an embodiment of the present invention, in a scan flip flop circuit, one standard cell is configured by: a 3-input selection circuit for selecting one signal from three input signals; and a flip flop circuit. The 3-input selection circuit receives a control signal supplied from a control circuit and a test signal by its control input part and its first input part, respectively. First and second signals are supplied to second and third input parts, and a selection signal of two values associated with the first and second signals is supplied to a selector input part. On the basis of the control signal and the selection signal, any of the signals input to the first to third input parts is output.

In the embodiment, the 3-input selection circuit is a circuit in which the function of the 2-input selection circuit of the ACS circuit and the function of the 2-input selection circuit for scan path are merged, and the 3-input selection circuit is provided in a standard cell. Consequently, the number of selection circuits as logical delay elements is reduced and the logical delay can be reduced. In addition, wiring between the 2-input selection circuits is unnecessary, so that wiring delay can be reduced. Therefore, a scan test can be introduced also to the system LSI having the ACS circuit.

BRIEF DESCRIPTION OF THE DRAWINGS

FIG. 3 is a block diagram showing the configuration of a scan flip flop circuit of a first embodiment according to the present invention.

FIG. 4 is a diagram showing a logical value table of a 3-input selection circuit of the scan flip flop circuit of the first embodiment according to the invention.

FIG. 5 is a symbol diagram of the scan flip flop circuit of the first embodiment according to the invention.

DETAILED DESCRIPTION OF THE PREFERRED EMBODIMENTS

ACS Circuit

Figure 1:
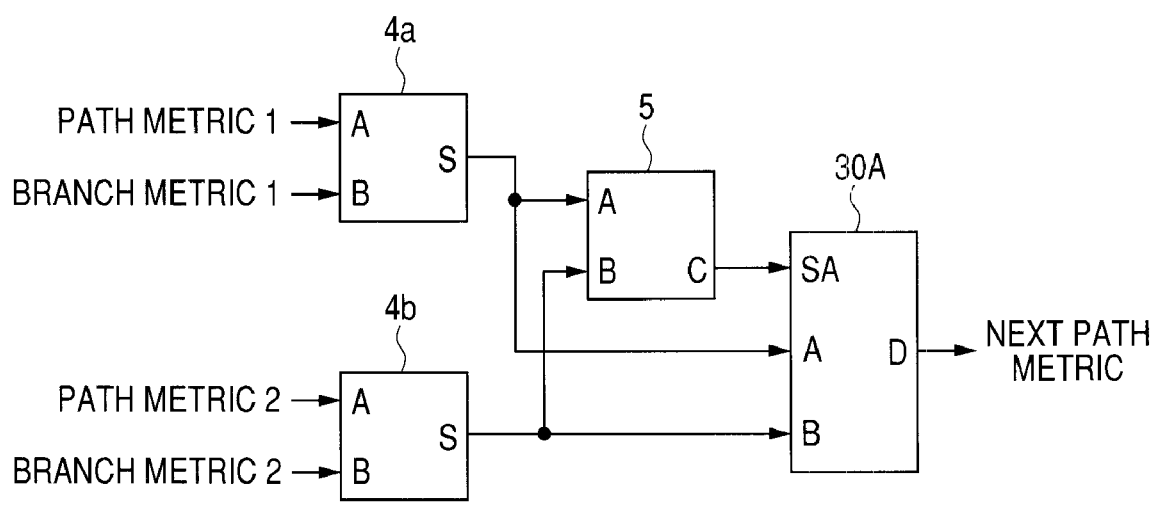
FIG. 1 is a block diagram showing an ACS circuit.

Prior to description of embodiments of the invention, an ACS circuit will be described. FIG. 1 is a block diagram showing an example of the ACS circuit. The ACS circuit has adders 4a and 4b, a comparator 5 for receiving outputs of the adders 4a and 4b and comparing the outputs, and a 2-input selection circuit 30A for selecting one of the outputs of the adders 4a and 4b and outputting the selected one on the basis of a comparison result of the comparator 5.

The adder 4a adds a path metric 1 input to an input part A and a branch metric 1 input to an input part B and outputs a result of the addition from an output part S. The adder 4b adds a path metric 2 input to an input part A and a branch metric 2 input to an input part B and outputs a result of the addition from an output part S.

The comparator 5 compares the addition result of the adder 4a input to an input part A and the addition result of the adder 4b input to an input part B, and outputs the comparison result from an output unit C. In the example, in the case where the value supplied to the input part A is smaller, the logical value "1" is output to the output part C. In the other case, the logical value "0" is output.

The 2-input selection circuit 30A outputs the signal given to the input part A when the logical value "1" is given to a control input part SA, and outputs the signal given to the input part B to an output part D when the logical value "0" is given to the control input part SA.

Therefore, the ACS circuit shown in FIG. 1 realizes the function of outputting the result of addition of the path metric 1 and the branch metric 1 when the result of addition of the path metric 1 and the branch metric 1 is smaller than the result of addition of the path metric 2 and the branch metric 2.

As described above, in the ACS circuit, generally, a delay caused by the comparator after a delay caused by the adders occurs. After that, a delay caused by the selection circuit occurs.

In a sequence of communication information, an amount obtained by adding errors in possible paths (paths in which the state of information changes due to an error accompanying transfer of information) is expressed by an amount called a path metric. The branch metric expresses the difference between an ideal point of information (point at which no error accompanying transfer of information exists and the original state is maintained also when the information is transferred) and an actual reception point (point when an error accompanying transfer of information exists), that is, an error amount from the ideal point.

By adding the path metric and the branch metric, likelihood of an arbitrary information sequence can be expressed in an amount. The method of determining an information sequence of the smallest value as the most accurate information sequence and employing it as reception data is the Viterbi decoding method. The ACS circuit realizes the function of the Viterbi decoding means.

In the ACS circuit, a branch metric value of sampled data has to be determined every data sampling. The data sampling is performed every cycle of the clock frequency. In each cycle, determination in the ACS circuit has to be always executed, and there is a limitation that the ACS circuit has to complete the logic computation within one cycle. Therefore, in the communication system, the ACS circuit is a very important element for determining the operation frequency.

In the communication system, by shortening the data sampling interval, a large amount of data can be transmitted. There is a demand for shortening the data sampling interval, that is, shortening time of the operation frequency cycle. It is very important to increase the speed of the operation of the ACS circuit from the viewpoint of improving the performance of the communication system.

Example of Applying Scan Flip Flop Circuit to ACS circuit

An example of applying a scan flip flop circuit to an ACS circuit in the case of performing a scan test on the above-described ACS circuit will now be described with reference to FIG. 2.

Figure 2:
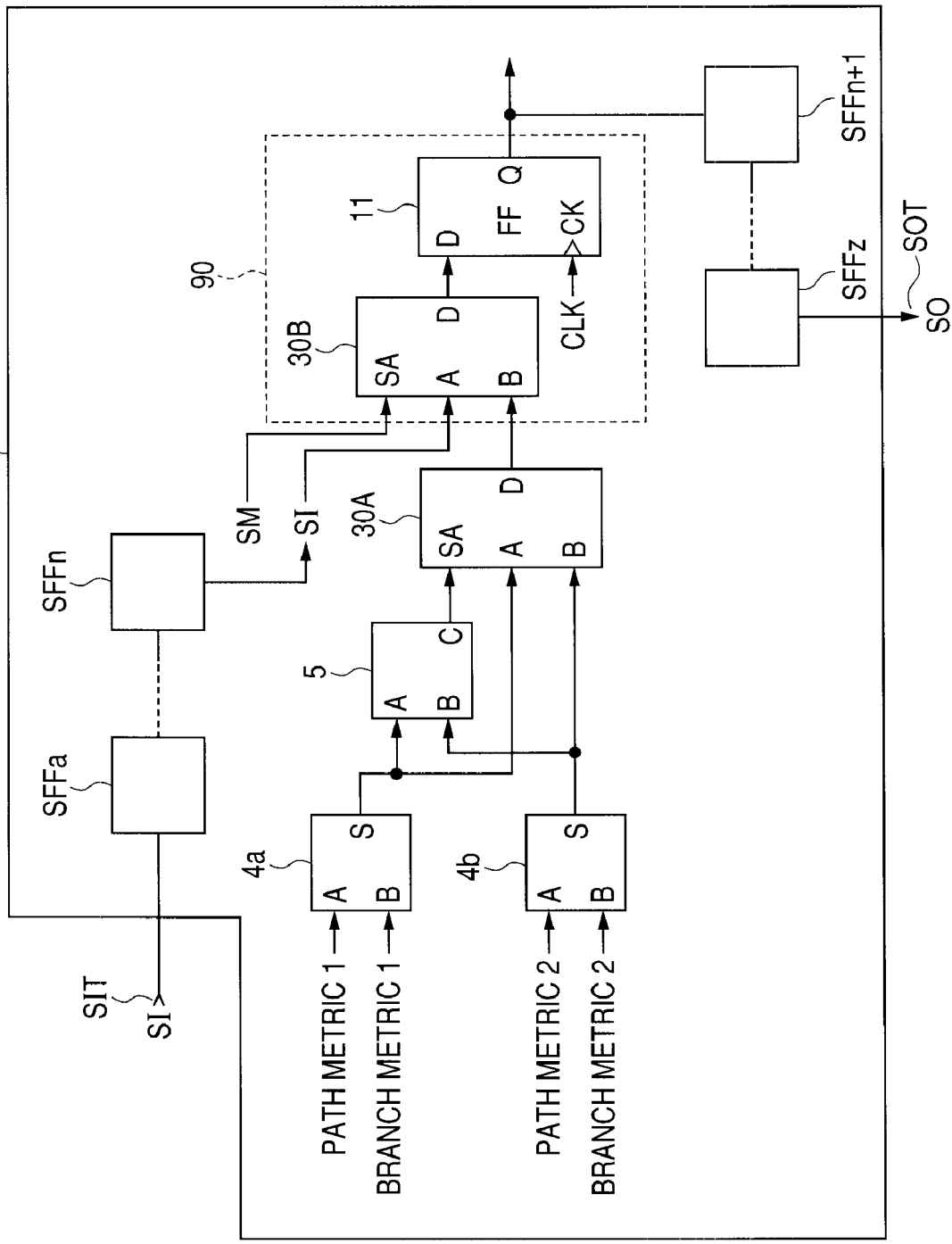
FIG. 2 is a block diagram showing an example of application of a scan flip flop circuit to the ACS circuit.

FIG. 2 shows the configuration of a semiconductor device 1000 in the case of applying a scan flip flop circuit 90 to the ACS circuit illustrated in FIG. 1. The same reference numerals are designated to the same components as those of the ACS circuit shown n FIG. 1, and repetitive description will not be given.

As shown in FIG. 2, the scan flip flop circuit 90 has a 2-input selection circuit 30B and a flip flop circuit 11. A test signal SI given from a not-shown control circuit via a scan input terminal SIT is supplied to an input part A of the 2-input selection circuit 30B via a plurality of scan flip flop circuits SFFa to SFFn (scan flip flops on the ante stage). An output of the 2-input selection circuit 30A is supplied to an input part B. On the basis of a control signal SM given from a not-shown control circuit to the control input part SA, one of signals input to the input parts A and B is output from an output part D. The flip flop circuit 11 receives an output from the 2-input selection circuit 30B by its input part D, executes flip flop operation at a timing of a clock signal CLK supplied to a clock input CK, and outputs a signal from an output part Q. The output of the output part Q is supplied to another circuit in the semiconductor device and is output as a test output SO from a scan output terminal SOT to the outside via a plurality of scan flip flop circuits SFFn+1 (the scan flip flop at the next stage) to SFFz.

By applying the scan flip flop circuit 90 as described above, the 2-input selection circuit 30B and the flip flop circuit 11 are added as delay elements to the ACS circuit. As compared with a test using a flip flop circuit, at least, delay time of only the amount of the 2-input selection circuit 30B increases.

A. First Embodiment

A scan flip flop circuit of a first embodiment of the present invention will be described below with reference to FIGS. 3 to 5.

FIG. 3 is a block diagram showing the configuration of a scan flip flop circuit 100 with a selector configured as a standard cell (design data registered in a library of a design system). As shown in FIG. 3, the scan flip flop circuit 100 with a selector has a 3-input selection circuit 10 for selecting one signal from three input signals and the flip flop circuit 11.

In the 3-input selection circuit 10, a control signal SM and a test signal SI supplied from a not-shown control circuit are given to a control input part SA and an input part A, respectively. Output signals D1 and D2 corresponding to addition results in not-shown two adders (corresponding to the adders 4a and 4b shown in FIG. 2) are supplied to input parts B and C, respectively. A selection signal SEL1 as a binary signal output from a not-shown comparator (corresponding to the comparator 5 shown in FIG. 2) and associated with the output signals D1 and D2 is supplied to a selector input part SL. On the basis of the control signal SM and the selection signal SEL1, any of the signals input to the input parts A to C is output from the output part D.

The flip flop circuit 11 receives an output from the 3-input selection circuit 10 by its input part D, executes a flip flop operation at the timing of the clock signal CLK given to the clock input CK, and outputs the resultant signal from an output part Q.

FIG. 4 shows a logical value table of the 3-input selection circuit 10. As shown in FIG. 4, in the case where the logical value of the control signal SM is "1" (significant condition), the test is regarded as a scan test on the system LSI, the test signal SI is selected irrespective of the logical value of the select signal SEL1, and output from the output part D. On the other hand, in the case where the logical value of the control signal SM is "0" (no-significant condition), it is regarded that the system LSI operates normally. When the logical value of the select signal SEL1 is "1", the signal D1 is selected and output from the output part D. When the logical value of the select signal SEL1 is "0", the signal D2 is selected and output from the output part D.

It has been described with reference to FIG. 3 that the scan flip flop circuit 100 with a selector includes the 3-input selection circuit 10 and the flip flop circuit 11. As long as the scan flip flop circuit 100 is a circuit having the function satisfying the logical value table shown in FIG. 4, the configuration is not limited.

FIG. 5 is a symbol diagram of the scan flip flop circuit 100 with a selector formed as a standard cell, which is a basic unit handled by an automatic placing and wiring tool used at the time of designing an LSI.

As described above, the scan flip flop circuit 100 with a selector has, in a standard cell, the 3-input selection circuit 10 in which the function of the 2-input selection circuit 30A of the ACS circuit shown in FIG. 2 and the function of the 2-input selection circuit 30B for scan path are merged and the flip flop circuit 11. Consequently, the number of selection circuits as logical delay elements is reduced and the logical delay can be reduced. In addition, wiring between the 2-input selection circuits 30A and 30B is unnecessary, so that wiring delay can be reduced. Therefore, a scan test can be introduced to the system LSI having the ACS circuit.

B. Second Embodiment

A scan flip flop circuit of a second embodiment according to the present invention will now be described with reference to FIGS. 6 and 7.

Figure 6:
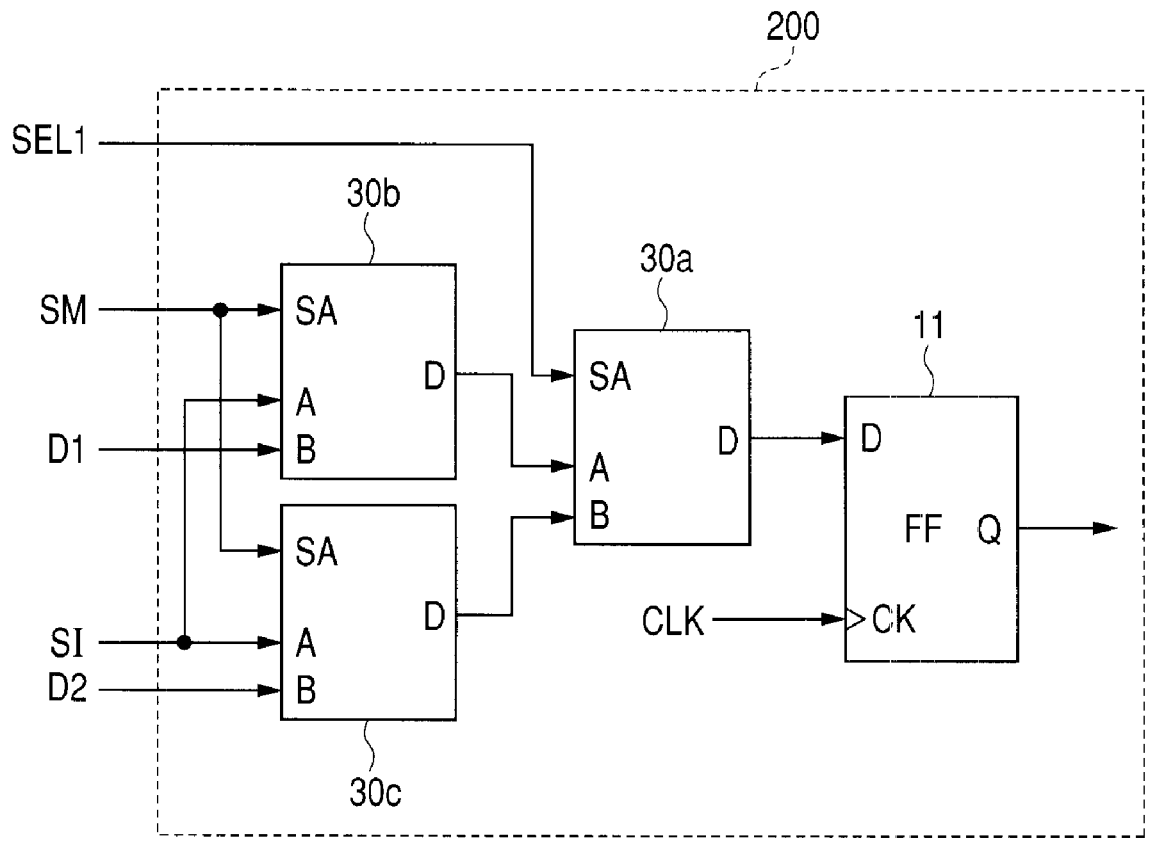
FIG. 6 is a block diagram showing the configuration of a scan flip flop circuit of a second embodiment according to the invention.

FIG. 6 is a block diagram showing the configuration of a scan flip flop circuit 200 with a selector. The scan flip flop circuit 200 has three 2-input selection circuits 30a, 30b, and 30c (first, second, and third 2-input selection circuits) in place of the 3-input selection circuit 10 shown in FIG. 3. The same reference numerals are designated to the same components as those of the scan flip flop circuit 100 with a selector shown in FIG. 3 and repetitive description will not be repeated.

Each of the selection circuits 30a to 30c is a circuit for outputting a signal supplied to an input part A to an output part D when the logical value of a signal supplied to a control input part SA is "1", and outputting a signal supplied to an input part B to the output part D when the logical value of a signal supplied to the control input part SA is "0".

In the scan flip flop circuit 200 with a selector, a control signal SM supplied from a not-shown control circuit is given to the control input part SA of each of the 2-input selection circuits 30b and 30c. A test signal SI supplied from a not-shown control circuit is given to the input part A in each of the 2-input selection circuits 30b and 30c. Output signals D1 and D2 from not-shown two adders (corresponding to the adders 4a and 4b shown in FIG. 2) are supplied to the input parts B of the 2-input selection circuits 30b and 30c.

Outputs of the 2-input selection circuits 30b and 30c are supplied to the input parts A and B of the 2-input selection circuit 30a and a selection signal SEL1 input from a not-shown comparator (corresponding to the comparator 5 shown in FIG. 2) is supplied to the control input part SA of the 2-input selection circuit 30a.

The 2-input selection circuits 30b and 30c outputs any of the signals input to the input parts A and B from the output part D on the basis of the control signal SM. The 2-input selection circuit 30a outputs any of signals input to the input parts A and B from the output part D on the basis of the selection signal SEL1. At the time of a test, the logical value of the control signal SM enters the significant state ("1" in this case). The test signal SI is output from each of the 2-input selection circuits 30b and 30c and input to the 2-input selection circuit 30a. In this case, the 2-input selection circuit 30a outputs the test signal SI whichever the signals supplied to the input parts A and B is selected on the basis of the selection signal SEL1. Consequently, in the case where the logical value of the control signal SM is "1", an operation of selecting the test signal SI irrespective of the logical value of the selection signal SEL1 and outputting it from the output part D is performed.

The flip flop circuit 11 receives an output from the 2-input selection circuit 30a by the input part D, executes the flip flop operation at the timing of a clock signal CLK supplied to a clock input part CK, and outputs a signal from a output part Q.

A symbol diagram in the case of configuring the scan flip flop circuit 200 with a selector shown in FIG. 6 as a standard cell is similar to FIG. 5. The configurations of the 2-input selection circuits 30a to 30c and the flip flop circuit 11 are not limited as long as circuits can realize the corresponding functions.

Figure 7:
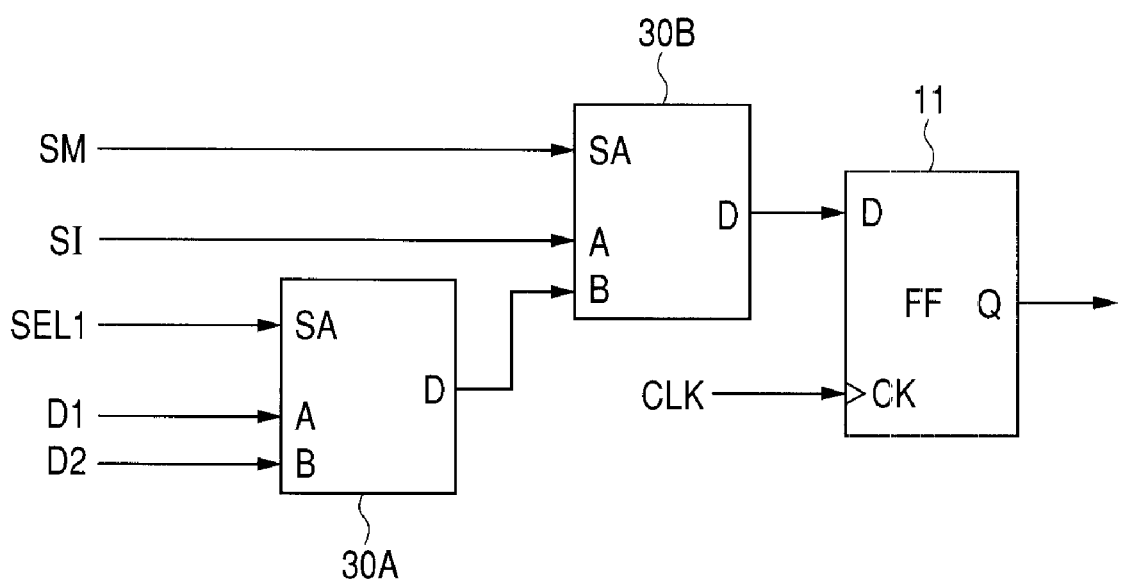
FIG. 7 is a block diagram for explaining characteristics of the scan flip flop circuit of the second embodiment according to the invention.

For comparison, FIG. 7 selectively shows the 2-input selection circuits 30A and 30B and the flip flop circuit 11 in the configuration in which the scan flip flop circuit is applied to the ACS circuit illustrated in FIG. 2.

In the configuration shown in FIG. 7, the signal D1 or D2 selected by the selection signal SEL1 is supplied to the flip flop circuit 11 via the 2-input selection circuit 30B controlled by the control signal SM. Consequently, after determination of the selection signal SEL1, the signal passes through two logic blocks, so that logic delay becomes large.

That is, in the ACS circuit, the signals D1 and D2 are determined by the adders 4a and 4b and compared with each other in the comparator 5, and the selection signal SEL1 is generated. The selection signal SEL1 is consequently determined later than the comparison of the signals D1 and D2. In the configuration of FIG. 7, from the selection signal SEL1 determined later, the signal passes through two logic blocks. On the other hand, the scan flip flop circuit 200 with a selector shown in FIG. 6 employs the configuration of supplying the signals D1 and D2 determined at a timing relatively earlier than the selection signal SEL1 to the 2-input selection circuits 30b and 30c controlled by the control signal SM. By disposing the 2-input selection circuits 30b and 30c at the ante stage of the 2-input selection circuit 30a controlled by the selection signal SEL1, after determination of the selection signal SEL1 determined later, the signal can be supplied to the flip flop circuit 11 after passing through one logic block.

Consequently, the configuration is equivalent to the configuration obtained by substantially eliminating the selection circuit for a scan test as a factor of increasing the logic delay. Delay occurring after determination of the selection signal SEL1 can be suppressed, and a scan test can be introduced also to a system LSI having the ACS circuit.

Since the test signal SI is supplied to the ACS circuit via logic blocks of the number smaller as compared with the case of the control signal SM, there is the possibility that the delay time varies between the control signal SM and the test signal SI. In this case, there is the possibility that a hold error occurs. However, in the scan flip flop circuit 200 with a selector, the number of logic blocks to the flip flop circuit 11 is larger than that in the configuration of FIG. 7 when viewed from the test signal SI. A margin against a hold error peculiar to the scan flip flop circuit increases, and there is also an effect that the hold error can be suppressed.

C. Third Embodiment

A scan flip flop circuit of a third embodiment according to the present invention will now be described with reference to FIG. 8.

Figure 8:
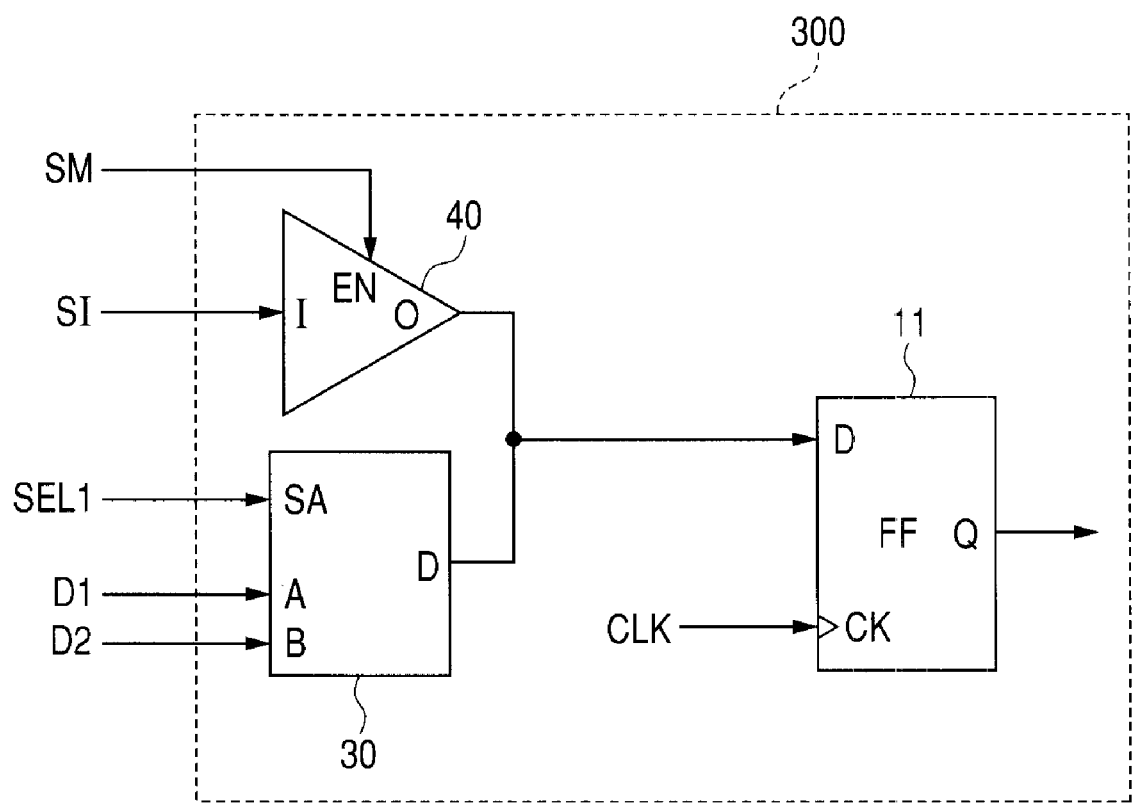
FIG. 8 is a block diagram showing the configuration of a scan flip flop circuit of a third embodiment according to the invention.

FIG. 8 is a block diagram showing the configuration of a scan flip flop circuit 300 with a selector. The scan flip flop circuit 300 has a tristate circuit 40 and a 2-input selection circuit 30 for selecting one signal from two input signals in place of the 3-input selection circuit 10 shown in FIG. 3.

In the tristate circuit 40, a test signal SI is output from an output part O in the case where the test signal SI and the control signal SM supplied from a not-shown control circuit are supplied to input parts I and EN, respectively, and the logical value of the control signal SM is "1". When the logical value of the control signal SM is "0", no signal is output. That is, the output part O is set to an open state or a high resistance (high impedance) state. Consequently, when the logical value of the control signal SM is "0", the tristate circuit 40 does not exert influence on the operation of other circuits.

Output signals D1 and D2 from not-shown two adders (corresponding to the adders 4a and 4b shown in FIG. 2) are supplied to the input parts A and B of the 2-input selection circuit 30. A selection signal SEL1 input from a not-shown comparator (corresponding to the comparator 5 shown in FIG. 2) is supplied to the control input part SA of the 2-input selection circuit 30.

The output part D of the 2-input selection circuit 30 and the output part O of the tristate circuit 40 are commonly coupled to the input part D of the flip flop circuit 11.

A symbol diagram in the case of configuring the scan flip flop circuit 300 with a selector shown in FIG. 8 as a standard cell is similar to FIG. 5. The configurations of the tristate circuit 40, the 2-input selection circuit 30, and the flip flop circuit 11 are not limited as long as circuits can realize the corresponding functions.

In the scan flip flop circuit 300 with a selector, when the control signal SM has the logical value "1", an output of the tristate circuit 40 and that of the 2-input selection circuit 30 collide each other. In this case, the driving performance of the output of the tristate circuit 40 is set to be higher than that of the output of the 2-input selection circuit 30 so that the output of the tristate circuit 40 becomes dominant. The driving performance in a large-scale integrated circuit denotes performance of passing current of a transistor as a component of the circuit (current driving performance). In a transistor of a CMOS structure as the majority of recent large-scale integrated circuits, the current driving performance is specified according to the gate width. Therefore, by making the gate width of an output transistor of the tristate circuit 40 larger than that of the output transistor of the 2-input selection circuit 30, when the logical value of the control signal SM is "1", irrespective of the values of the selection signal SEL1 and the signals D1 and D2, the value of the test signal SI is input to the flip flop circuit 11.

Since the scan flip flop circuit 300 with a selector is formed as the standard cell, the gate width of the output transistor of the tristate circuit 40 and that of the output transistor of the 2-input selection circuit 30 can be sufficiently adjusted at the time of circuit designing.

The operation and effect of the scan flip flop circuit 300 with a selector will now be described. When the logical value of the control signal SM is "0", that is, in normal operation of the system LSI, the tristate circuit 40 does not exert the influence on the operations of the other circuits. Consequently, the operation with delay time similar to that in the case where a circuit for scan test does not exist can be realized. Since the 2-input selection circuit 30 and the flip flop circuit 11 are provided in the standard cell, wiring between the circuits can be shortened, and wiring delay can be reduced. Thus, a scan test can be introduced in the system LSI having the ACS circuit.

On the other hand, when the logical value of the control signal SM is "1", that is, in scan path operation at the time of a test of the system LSI, an output of the tristate circuit 40 becomes dominant. Therefore, the test signal SI output from the tristate circuit 40 is supplied to the flip flop circuit 11. In this case, an output of the tristate circuit 40 and that of the 2-input selection circuit 30 collide each other. An output of the tristate circuit 40 becomes dominant and it takes time until the output is supplied to the flip flop circuit 11. Consequently, it is dealt by making the cycle of the clock signal longer, and the speed of logical operation decreases. It is, however, unnecessary to increase the operation speed of a scan test of the system LSI to that of the normal operation, so that no problem occurs.

Since the test signal SI is supplied to the ACS circuit while passing logic blocks of the number smaller than that of logic blocks through which the control signal SM passes, a difference may occur in delay time between the control signal SM and the test signal SI. In this case, a hold error may occur and adjustment to intentionally delay the test signal SI may be performed. In the scan flip flop circuit 300 with a selector, it takes time until the test signal SI is supplied to the flip flop circuit 11 as described above. There is also an effect that the hold error can be suppressed.

As described above, when any of the scan flip flop circuits of the first to third embodiments of the present invention is used, in the case of automatically designing the ACS circuit by using the EDA tool, delay caused by the configuration for a scan test can be reduced. Drop in the operation speed of the ACS circuit is suppressed, and application of a scan test to the ACS circuit is enabled. Thus, fault coverage can be improved.

On the other hand, a path delay on the scan path side increases. A hold error between scan flip flop circuits which occurs at the final stage of designing can be also avoided. It becomes unnecessary to set a delay element for preventing a hold error between scan paths and the like, and designing efficiency becomes very high. Simultaneously, since the delay element becomes unnecessary, there is an effect on reduction of the circuit area.

What is claimed is:

1. A semiconductor device comprising:
    a first adder, a second adder and a scan flip flop circuit;
    a 3-input selection circuit adapted to receive first and second addition results output from the first adder and the second adder, respectively, and a selection signal as input signals and to select and output one of the input signals in accordance with the selection signal;
    a tri-state circuit adapted to receive an output signal of an ante stage scan flip flop and a mode signal; and
    a flip flop circuit for receiving and storing an output of the 3-input selection circuit or an output of the tri-state circuit in response to a clock signal, selectively.

2. The semiconductor device according to claim 1,
    wherein the 3-input selection circuit is a comparator adapted to receive outputs of the first and second adders, compare addition values, and output a result of the comparison, and
    wherein the first and second adders add a path metric and a branch metric and output addition values as the first and second addition results, respectively.

3. The semiconductor device according to claim 1, wherein the 3-input selection circuit executes the selection operation based on a test control signal and a comparison result between the first and second addition results.

* * * * *